United States Patent [19]

Dilger et al.

[11] 4,328,526

[45] May 4, 1982

[54] APPARATUS FOR CONTROLLING THE CURRENT THROUGH AN ELECTROMAGNETICALLY ACTUATABLE INJECTION VALVE IN AN INTERNAL COMBUSTION ENGINE VALVE IN AN INTERNAL COMBUSTION ENGINE

[75] Inventors: Peter Dilger, Markgröningen; Günter Hönig, Ditzingen; Helmut Kauff, Schwieberdingen, all of Fed. Rep. of Germany

[73] Assignee: Robert Bosch GmbH, Stuttgart, Fed. Rep. of Germany

[21] Appl. No.: 110,163

[22] Filed: Jan. 7, 1980

[30] Foreign Application Priority Data

Jan. 9, 1979 [DE] Fed. Rep. of Germany ....... 2900420

[51] Int. Cl.[3] ............................................. H03K 1/14

[52] U.S. Cl. .................................... 361/154; 123/490

[58] Field of Search .................. 361/154; 123/32 EA, 123/32 EF

[56] References Cited

U.S. PATENT DOCUMENTS

| | | | |
|---|---|---|---|
| 3,864,608 | 2/1975 | Normile et al. | 361/154 |
| 4,148,090 | 4/1979 | Kawai et al. | 361/154 |
| 4,180,026 | 12/1979 | Schulzke et al. | 361/154 |
| 4,225,898 | 9/1980 | Weber et al. | 361/154 |

*Primary Examiner*—J. D. Miller
*Assistant Examiner*—L. C. Schroeder
*Attorney, Agent, or Firm*—Edwin E. Greigg

[57] ABSTRACT

An apparatus for controlling the current through an electromagnetic injection valve of an internal combustion engine during its pickup and holding phases by opening and closing a first switch connecting the valve to a voltage source. The first switch is initially closed by a valve timing circuit to initiate pickup of the valve. A first current-sensing resistor connected in series with the first switch produces a signal to open the first switch when the valve current attains an upper threshold value which assures valve pickup, and to close a second switch connected in series with a second current-sensing resistor across the valve. When the valve current drops to a lower threshold value greater than the valve drop-out current, the second current-sensing resistor produces a signal to reclose the first switch and open the second switch for a predetermined time, after which the first switch is again opened and the second switch closed. The cyclic opening and closing of these switches by the second current-sensing resistor continues until both switches are opened by the valve timing circuit. In another embodiment, the pickup time of the valve is determined by measuring the time for the valve current to increase to a predetermined value after it is first energized by the value timing circuit, and the valve holding time is adjusted in accordance with the valve pickup time, to assure correct fuel injection even when the voltage source is not maintained constant.

12 Claims, 7 Drawing Figures

APPARATUS FOR CONTROLLING THE CURRENT THROUGH AN ELECTROMAGNETICALLY ACTUATABLE INJECTION VALVE IN AN INTERNAL COMBUSTION ENGINE VALVE IN AN INTERNAL COMBUSTION ENGINE

BACKGROUND OF THE INVENTION

The invention relates to an apparatus for controlling the current through an electromagnetically actuatable injection valve in internal combustion engines. An apparatus is already known from German Patent Application P No. 26 12 914.6 for the electrical current controlled triggering of electromagnetic switching systems, in which a series circuit comprising a switching transistor, at least one injection valve and a measuring resistor is located between the lines supplying operating voltage. The free-running circuit thereby includes both the injection valves and the measuring resistor, so that the voltage drop across the measuring resistor is continuously a standard for the current through the magnetic valve.

Rapid switching of electromagnetic valves requires a rapid increase in electrical current, which because of given physical properties can be attained only by means of a relatively high flow of current. However, only a relatively low current flow is required for holding the magnetic valves open. Therefore, in the known apparatuses, a high current flow through the magnetic valves is sought at first, which then, during the holding phase of the magnetic valve, swings back and forth in a low-level range between two values. This means, first, that a threshold switchover is required for a threshold switch associated with the measuring resistor, and, second, that widely differing threshold values must be mastered. The lower threshold value is particularly problematic, because the measuring resistors are intended to have a very low value (50 milliohm) with a view to a low power loss, and therefore the voltage drop across the resistor is also very low, at the minimum electrical current prevailing during the holding phase.

Furthermore, the dependency of the attracting time of the magnetic valves on operating voltage has proved to be disadvantageous, for differing operating voltages also effect differing increases in the pick-up current and therefore differing injection times.

OBJECTS AND SUMMARY OF THE INVENTION

Therefore, it is an object of the invention to provide an effective correction in the injection time which is dependent on the course of the pick-up current.

The apparatus in accordance with the invention as disclosed herein has the advantage over the apparatus of the prior art that with the separated measuring resistors for the current through the electromagnetic device during the current increase and current decrease phases, voltage thresholds can be attained which can be relatively simply controlled. As a result, the minimum value of the current during the holding phase of a magnetic valve, for example, can be placed near the critical drop-out range of the magnetic valve, which brings about a considerable saving in energy and a reduction in power loss during operation of the electromagnetic device.

It is particularly advantageous that the correction in injection time of an electromagnetic injection valve is based on and dependent on the value for the pick-up time of the electromagnetic valve or the period of time required for attaining the selected maximum current threshold. Furthermore, it has proved to be efficient to place the first current threshold at a relatively low level, to measure the period of time until this threshold is attained, and to select a particular instant in accordance therewith for the first shut-off of the switching means in series with the electromagnetic valve.

The invention will be better understood and further objects and advantages thereof will become more apparent from the ensuing detailed description of preferred embodiments taken in conjunction with the drawings.

DESCRIPTION OF THE PREFERRED EMBODIMENTS

Figure 1:
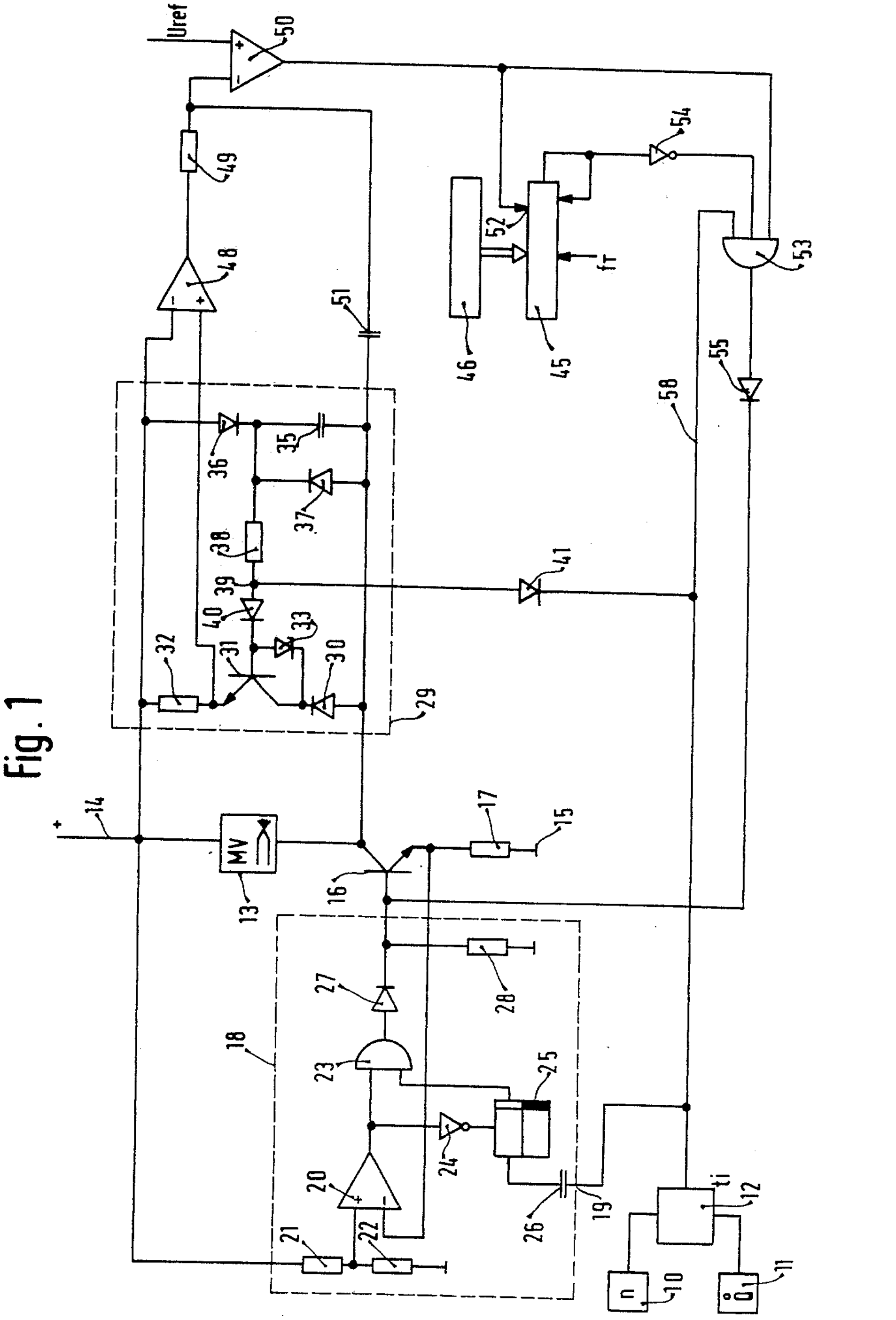
FIG. 1 is an electrical schematic diagram of an apparatus for controlling the current through an electromagnetic device.

FIG. 1 shows an apparatus for controlling the current through an electromagnetic device, expecially an electromagnetically actuatable injection valve in an internal combustion engine. Reference numerals 10 and 11 indicate two transducers for the rpm and the air mass flowing through the air intake manifold respectively, the output signals of the two transducers 10 and 11 are supplied to a timing circuit 12. Output signals of this timing circuit 12 are injection pulses of duration $t_i$ which finally cause the energizing of an electromagnetically actuated injection valve 13. Before the details of FIG. 1 are discussed, the desired course of electrical current through the magnetic valve 13 will be explained with the aid of FIGS. 2*a* and 2*b*. In FIG. 2*a*, the output signal of the timing circuit 12 is represented as a positive output pulse of length $t_i$. During this period, the course of electrical current through the magnetic valve 13 should correspond to the diagram given in FIG. 2*b*. Subsequently, following the most rapid current increase possible (that is, the pick-up phase), there is a so-called holding phase with a current alternating in a particular range, because less energy is required for holding a magnetic valve open than is required for opening the valve in the first place. It is important in this connection that in the subject of the present invention the first, upper current threshold $Ia_{max}$ and the subsequent, minimum current thresholds $IH_{min}$ are ascertained and the particular current increase during the holding phase is controlled in accordance with time. The corresponding switching mode of a switching means located in series with the magnetic valve 13 is controlled in accordance with the circuit diagram of FIG. 1.

A transistor 16 and a measuring resistor 17 are connected in series with the magnetic valve 13 between the two operating voltage terminals 14 and 15. The transistor 16 is triggered by an input stage 18, which in turn has, an input 19 for receiving the output signal from the timing circuit 12. The primary component of the input stage 18 is a threshold switch 20. The positive input of the threshold switch 20 is connected to the junction of two resistors 21 and 22 which are connected in series between the operational voltage supply lines 14 and 15, to form a voltage divider circuit. The negative input of the threshold switch 20 is connected to the junction of the transistor 16 and the measuring resistor 17. The output of the threshold switch 20 is connected to a first input of an AND gate 23 and, via an inverter 24, to the reset input of a flip-flop 25. This flip-flop 25 receives its set signal via a capacitor 26 from the input 19 of the input stage 18 and passes its non-inverted output signal on to the second input of the AND gate 23. The output of the AND gate 23 is connected via a diode 27 with the base of the transistor 16. A base resistor connected between the base of the transistor 16 and ground.

A free-running circuit 29 parallel to the magnetic valve 13 contains a series circuit made up of diode 30, transistor 31 and resistor 32, the resister 32 being connected at one end to the positive lead 14. The base-collector path of the transistor 31 is bypassed with a Zener diode 33. Further, parallel to the magnetic valve 13, there is a series circuit made up of a capacitor 35 and a diode 36, with the anode of the diode 36 connected to the positive lead 14. There is also an oppositely switched diode 37 parallel to the capacitor 35. The connection point of the two diodes 36 and 37 with the capacitor 35 is connected via a resistor 38 and a connection point 39 to the anodes of two diodes 40, 41. The diode 40 is connected between the connection point 39 and the base of the transistor 31 and the diode 41 is connected between the connection point 39 and the output of the timing circuit 12.

The time-dependent control of the flow of electrical current through the transistor 16 during the holding phase of the magnetic valve 13, that is, the so-called pumping phases, is effected by a counter 45 together with a memory 46 and the remaining circuitry shown in FIG. 1. This circuitry comprises an amplifier 48, whose negative input is coupled with the positive lead 14 and whose positive input is connected to the connecting point of the transistor 31 and the resistor 32. The amplifier 48 receives the voltage signal across the resistor 32. The output signal of the amplifier 48 is supplied via a resistor 49 to the negative input of a threshold switch 50, at the positive input of which a reference voltage $U_{ref}$ is applied. The reliable switching of this threshold switch 50 at the onset of the free-running phase is also effected by a capacitive connection via a capacitor 51 from the negative input of the threshold switch 50 to the connecting point of the switching transistor 16 and the magnetic valve 13. The output of, the threshold switch 50 is connected to the charging input 52 of the counter 45 and to a first input of an AND gate 53. A second input of the AND gate 53 receives its triggering signal via an inverter 54 from the overflow output of the counter 54; a third input of the AND gate 53 is coupled via a line 58 with the output of the timing circuit 12. The output of the AND gate 53, is connected to the anode of a diode 55 whose cathode is connected to the base of the transistor 16.

Before the time $t_o$ (see FIG. 2*b*), a zero signal is present at the output of the timing circuit 12 and the transistor 16 is blocked. This state is intended to have already prevailed for a certain period of time, so that an electrical current is no longer flowing in the free-running circuit 29, and the entire system is in a state of rest. Because of there is no flow of current, the emitter potential of the transistor 16 is also at a very low value, so that a high signal is present at the output of the threshold switch 20. Because the flip-flop 25 is not yet set, a zero signal is present at its non-inverting output, so that the AND gate 23 blocks. As a result of this fact, the base potential of the transistor 16 also remains low and the transistor itself blocks.

If at time $t_o$ a positive signal appears at the output of the timing circuit 12, then the flip-flop 25 is set via the capacitor 26; a positive signal appears at its non-inverting output; the AND gate 23 switches into its conductive state; and this in turn causes the transistor 16 to become conductive. The electrical current begins to flow through the magnetic valve 13, the transistor 16 and the measuring resistor 17.

Figure 2B:
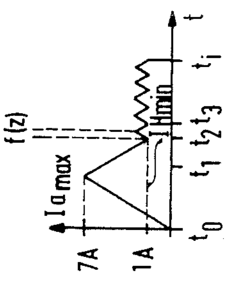
FIGS. 2*a* and 2*b* show two pulse diagrams for the purpose of explaining the mode of operation of the apparatus of FIG. 1.
Figure 2A:
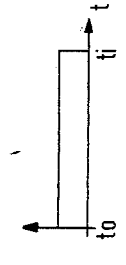

If the voltage across the resistor 17 attains a value at which, as shown in FIG. 2*b*, the maximum attracting current $Ia_{max}$ is attained, then the threshold switch 20 switches over and its output potential is dropped to zero. This, in turn, causes a resetting of the flip-flop 25 via the inverter 24. Because the next setting pulse for this flip-flop 25 appears again only at the beginning of the next injection pulse of duration $t_i$, the AND gate 23 now remains continuously blocked until the beginning of the next injection pulse. The intermittent conductivity of the transistor 16 during the holding phase is thus controlled via the diode 55.

Before the time $t_o$—that is, before the beginning of an injection pulse of duration $t_i$—the free-running circuit made up of the diode 30, the transistor 31, and the resistor 32 has no current running through it. This is because a conductive transistor 31 requires a more positive potential on the base relative to the emitter; however, in the resting state of the circuit, this condition is not fulfilled.

If the transistor 16 blocks at time $t_1$, then the voltage increase at the collector of the transistor 16 is transmitted to the base of the transistor 31 via the capacitor 35, the resistor 38 and the diode 40. This transistor 31 then becomes conductive and provides a path for the current flowing through the magnetic valve 13. As a result, a voltage drop is brought about over the resistor 32 and the emitter potential of the transistor 31 drops. The base potential, becuase of how the free-running circuit is laid out, is positive relative to the emitter potential while current is flowing, and thus the transistor 31 also remains conductive.

Because the electrical circuit is the free-running condition is subject to resistance (for example, between times $t_1$ and $t_2$), the voltage drop over the resistor 32 decreases continuously. If the voltage falls below a desired threshold, this is ascertained by means of the threshold switch 50. The flow of current during the free-running phase (for example, between $t_1$ and $t_2$) causes a positive signal at the output of the amplifier 48. The subsequent threshold switch 50 thus emits a zero signal at its output. Reliable control of this threshold switch 50 in its blocked state is provided by the capacitor 51, for at the beginning of free-running operation, a positive pulse is transmitted via this capacitor 51 to the negative input of the threshold switch 50, which thus reliably blocks.

A zero signal at the output of the threshold switch 50, in turn, causes a zero signal to be present at the output of the AND gate 53, so that the transistor 16 can not be switched via the diode 55 to become conductive during the free-running phase.

If at time $t_2$ the lower electrical current threshold $IH_{min}$ is attained, then the threshold switch 50 again switches over to a positive output signal. This effects charging of the counter 45 with a value from the memory 46, and the counter process in the counter 45 begins with a fixed frequency. During this counting process, no positive signal appears at the overflow output of the counter, and thus the inverter 54 passes a positive signal on to the AND gate 53; the AND gate 53 thus switches over into its conductive state, and to supply the positive signal to the base of the transistor 16 via the diode 55 and the transistor 16 again switches to its conductive state.

At time $t_3$, a positive signal is supposed to appear at the overflow output of the counter 45. As a result, the AND gate 53 blocks and thus the transistor 16 blocks as well. After the switchover at time $t_3$, the free-running circuit 29 again becomes conductive because of the voltage jump transmitted via the capacitor 35; the voltage across the resistor 32 reverts once again, and the next switching procedure on the part of the transistor 16 once again occurs upon the attainment of the lower electrical current threshold $IH_{min}$. The entire process begins anew.

If the injection pulse of length $t_i$ is at an end, then the zero voltage at the output of the timing circuit 12 also, pulls the potential at the connection point 39 in the free-running circuit 29 toward zero via the diode 41, so that the free-running circuit 29 blocks. Simultaneously, the AND gate 53 and thus the transistor 16 are blocked via the lead 58.

The values of 0.05 ohm for the resistor 17 and 0.5 ohm for the resistor 32 have proved to be favorable. These values make it clear that when the transistor 16 is switched to become conductive, the power loss in the resistor 17, even at a relatively high electrical current, can remain low, and the particular free-running electrical current can be called up efficiently during the free-running phase, because of the relatively high resistance of resistor 32.

Thus what is important in the subject of FIG. 1 are the call-up of the first maximum electrical current value at the threshold $Ia_{max}$ and the ascertainment of the particular minimum current values during the holding phase of the magnetic valve 13. The time-dependent control of the pumping phases—that is, of the durations of the periods when the transistor 16 is conductive during the holding phase—does not, it is true, bring about predeterminable maximum electrical current values during the holding phase; however, in view of the reliability of the switching on of the magnetic valve 13, that is of no consequence. What is important is only the reliable ascertainment, in view of the valve drop-out current value, of the particular lower electrical current threshold at a particular time.

Figure 3:
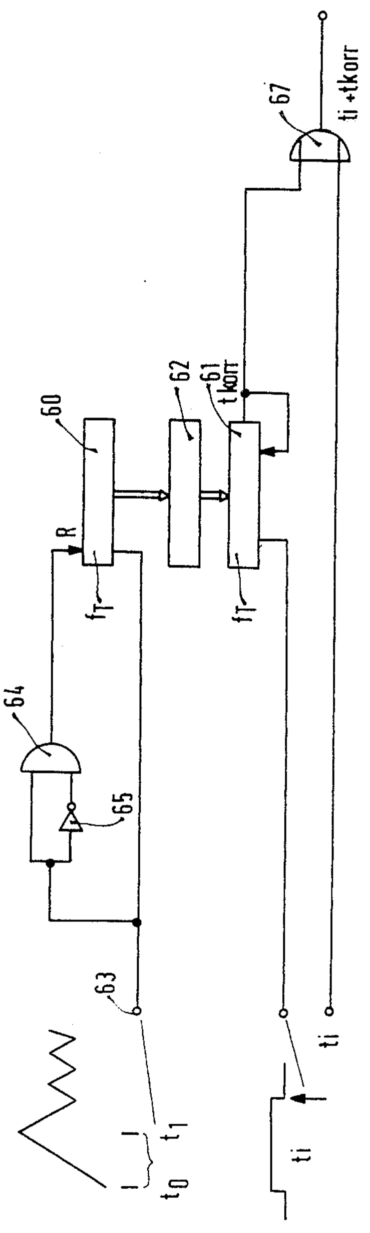
FIG. 3 is a partial circuit diagram of an apparatus for injection time correction of an electromagnetic injection valve based on the pick-up time of the valve.

FIG. 3 shows a circuit layout for correction of injection time based on the first switch-on duration—that is, the duration between $t_0$ and $t_1$ of FIG. 2*b*. The basic concept is that the increase of electrical current through the magnetic valve, because of given physical conditions, cannot be linear but rather represents a portion of an exponential function. The final value of the e-function is dependent on battery voltage, so that the duration as well, from the instant of switching on until the attainment of maximum electrical current at time $t_i$, is dependent on battery voltage. This duration is therefore measured and the output signal of the timing circuit 12 is corrected in accordance with the measurement product. The outlined concept can be realized by means of the subject of FIG. 3. This comprises two counters 60 and 61 and a read-only memory 62 located between them. At a first input 63 of the circuit layout of FIG. 3, a signal of duration $\overline{t_0\,t_1}$ appears, which can be picked up, for example, at the output of the AND gate 23 of the input stage 18 of FIG. 1. This "gating time" for the counter 16 is switched to a corresponding gating time input, while a resetting pulse for the counter 60 is generated via a differentiation element (realized by an AND gate 64 with an inverter 65 preceding it at one side). The task of the counter 60 is the conversion of the duration between $t_0$ and $t_1$ into a numerical value. In accordance with this value, a number empirically ascertained and contained in the memory 62 is now taken up into the second counter 61 and counted out, after the end of the original injection pulse of length $t_i$, with a fixed frequency $f_T$. The overflow output of the counter 61 is carried to an OR gate 67, at the second input of which the $t_i$ signal is present. The output signal of the OR gate 67 is thus a pulse having the length of the individual durations $t_i$ and the correction time $t_{korr}$.

At the beginning of the output signal from the timing circuit 12, the counter 60 is reset and the counting process begins. The process ends with the attainment of the upper electrical current threshold at time $t_1$. In accordance with the final numerical value in the counter 60, a numerical value is read out of the memory 62 and taken up into the counter 61, which at the end of the uncorrected injection signal of duration $t_i$ begins to count with a fixed counting frequency, until a zero appears at the output of the counter 61. With the subsequent OR gate 67, an addition of the two times $t_i$ and t2korr is possible, so that the corrected injection signal is present at the output of the OR gate 67. In an efficient manner, the circuitry shown in FIG. 3 is disposed directly after the output of the timing circuit 12 of FIG. 2. Thus, the duration of energization of the magnetic valve 13 is correctable, with the subject of FIG. 3, in accordance with the duration required for attainment of the maximum electrical current value.

Figure 4A:
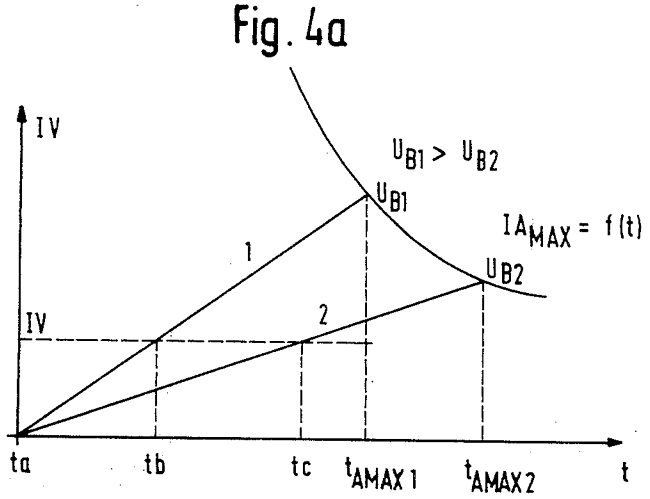
FIGS. 4*a*, 4*b*, and 4*c* are a block circuit diagram as well as two diagrams relating to the computation of the first current-flow duration based on the instant of attainment of a first current threshold during the pick-up of the electromagnetic device.

It may be efficient to determine the necessary electrical current flow time at the onset of an injection pulse by computation. The fundamental principle of this will be explained with the aid of the diagram of FIG. 4*a*. A hyperbolic measurement curve indicates the required period of time until the opening of the magnetic valve for a particular electrical current in the valve. In other words, it is the electrical current threshold curve for the pick-up of the magnetic valve as a function of time, $Ia_{max}=f(t)$. For different operating voltages, there are different points on the electrical current measurement curve, which means that the duration until the attainment of the maximum electrical current at a particular time is variable. From the zero point on the coordinate system (time, valve current), straight lines can be drawn to the various points on the measurement curve, of which line 1 and line 2 are examples. Both straight lines attain a freely selected electrical current threshold Iv at various times; line 1 does so at time tb and line 2 at time tc. Now by way of the set of geometric rays, the instant of intersection of the lines 1 and 2 with the measurement curve can be precisely determined. These durations (indicated in FIG. 4*a* as $ta_{max1}$ and $ta_{max2}$) can be ascertained empirically and correspondingly stored in memory and counted out.

Figure 4B:
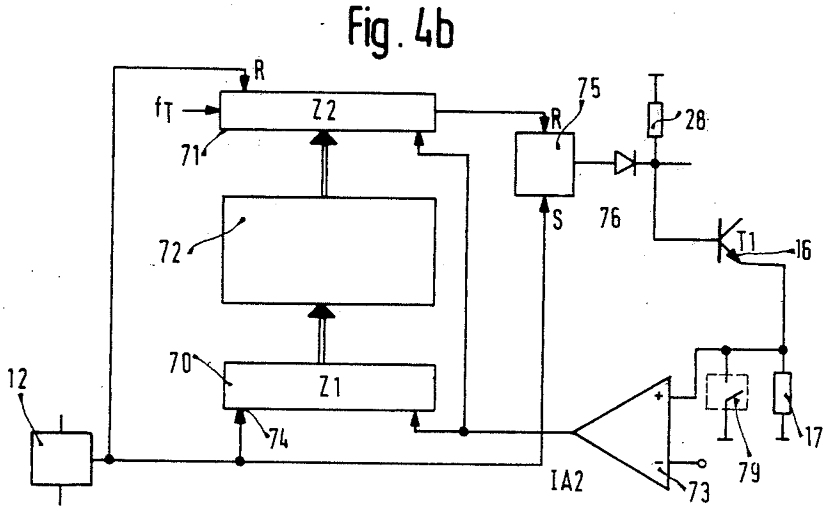

One realization of the computation of the durations of the first flows of electrical current through the magnetic valve 13 is given in FIG. 4*b*. Elements in this figure which are found in FIG. 1 as well are given the same reference numerals.

The subject of FIG. 4*b* has two counters 70 and 71 as well as memory 72. Here, as well, a comparator 73 is assigned to the measuring resistor 17, the output signal of the comparator 73 being carried to the enabling input of the counter 70 and the takeover input of the counter 71. The output of the timing circuit 12 is carried both to the reset input of the counter 71 and to a counting onset control input 74 of the counter 70, and finally also to the setting input of a flip-flop 75. The output of the counter 70 is connected to the reading memory 72, and in turn, the output of the reading memory 72 is connected to the value input of the counter 71. The overflow output of the counter 71 is connected to the reset input of the flip-flop 75. Its output, in turn, is connected via a diode 76 to the base of the transistor 16.

At the onset of an output signal of the timing circuit 12, the counter 70 begins its counting process; the flip-flop 75 is set; the transistor 16 is switched to be conductive; and, finally, the counter 71 is reset and remains so. Upon the attainment of the electrical current threshold $I_v$ of FIG. 4*a*, the counting process in the counter 70 is terminated, and a value appropriate to this last numerical value is taken out of the memory 72 and into the counter 71 as an initial value for a counting process then commencing. After the end of the counting process in this counter 71, or upon the appearance of an overflow pulse, the flip-flop 75 is reset and as a result the transistor 16 is blocked. This means that the total opening duration of the transistor 16 is made up of two times: a first time until the attainment of the electrical current threshold $I_v$ and a second time, which is the counting-out time of a value read out of the memory 72.

Because the counting-out process of the value read out of the memory 72 is independent of the level of the electrical current flowing through the magnetic valve, the resistor 17 can also be bypassed by means of a switch 79, in order to reduce the power loss, after the attainment of the electrical current threshold $I_v$. In this case, the measuring resistor 17, which in any event is of low ohmic value, is ineffective especially at higher electrical current levels, as a result of which the temperature stress on it can also be kept very low.

Figure 4C:
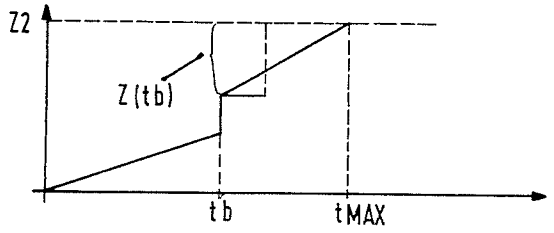

FIG. 4*c* represents the counter state of the particular contents of the counter 70 and 71, plotted over time. While the first rising straight line ends at time $t_b$, in dependence on the attainment of the electrical current threshold Iv of FIG. 4*a*, a value Z ($t_b$) from this final counter state of the counter 70 at this time $t_b$ is taken out of the memory 72 and put into the counter 71 and (as shown in FIG. 4*c*) counting is performed upward until the point of overflow. If this overflow point is attained, then the flip-flop 75 is reset and the transistor 16 is blocked.

Because of the kind of electrical current and time control means used, the apparatuses described above for controlling the electrical current through an electromagnetic device, especially an electromagnetically actuatable injection valve, exhibit an extremely precise mode of operation, which furthermore assures the operation of this electromagnetic consumer with very little power loss.

The foregoing relates to preferred exemplary embodiments of the invention, it being understood that other embodiments and variants thereof are possible within the spirit and scope of the invention, the latter being defined by the appended claims.

What is claimed and desired to be secured by letters patent of the United States is:

1. An apparatus having a voltage source for controlling the electrical current through an electromagnetic device, having a first electrical switching means and a first electrical current measuring device connected in series with the electromagnetic device across the voltage source, and having a free-running circuit and a first threshold switch connected to the first electrical current measuring device, characterized in that:

the free-running circuit includes a series circuit made up of second electrical switching means and a second electrical current measuring device; and the apparatus includes a first control means for time-dependently controlling the first switching means in accordance with the attainment of an upper threshold of the electrical current flowing through the electromagnetic device during a pickup operation of the electromagnetic device, and second control means for time-dependently controlling the first switching means in accordance with the attainment of a lower threshold of the electrical current flowing through the electromagnetic device during a holding operation of the electromagnetic device.

2. An apparatus in accordance with claim 1, wherein said electromagnetic device is an electromagnetically actuatable injection valve in an internal combustion engine.

3. An apparatus in accordance with claim 1, which comprises; a time control circuit for at least one of the two switching means; and at least one threshold switch having an input coupled to the first electrical current measuring device and coupled with said time control circuit.

4. An apparatus in accordance with claim 3, wherein said time control circuit comprises a counter having a charging input connected to the output of said at least one threshold switch, and a memory means for charging the counter with a value upon receipt of an output signal from said at least one threshold switch by the counter.

5. An apparatus in accordance with claim 1, wherein said second control means includes counting means for determining the time during which the first switching means is controlled after the attainment of said lower threshold value of the electrical current flowing through the electromagnetic device.

6. An apparatus in accordance with claim 1, wherein said free-running circuit comprises a second series circuit connected in parallel with said first series circuit of the free-runing circuit, the second series circuit consisting of a diode and a capacitor connected in series, the connecting point of the diode and capacitor being coupled to a control input of the second switch means, the control input of the second switching means also being connected to an input of the apparatus through another diode.

7. An apparatus in accordance with claim 1, wherein said first control means comprises:

means for supplying an input signal to the apparatus;

a flip-flop having an input connected to receive said apparatus input signal, and an output;

said threshold switch, having a first input coupled to said voltage source, a second input connected to receive a signal from the first electrical current measuring device proportional to the flow of current therethrough and an output; and an AND gate having an output connected to a control input of the first switching means, a first input connected to the output of said threshold switch, and a second input connected to the output of said flip-flop;

whereby the first switching means is closed, or rendered conductive, upon receipt of said apparatus input signal, and the first switching means is opened, or rendered non-conductive, when the current flowing therethrough attains said upper threshold value.

8. An apparatus in accordance with claim 1, wherein the first control means includes a first switch closing means for initially closing the first switching means to initiate pickup of the electromagnetic device, and the apparatus further comprises switch reset means, for opening the first and second switching means at a predetermined time after closing of the first switching means by the first switch closing means which is proportional to the duration of the pickup operation of the electromagnetic device.

9. An apparatus in accordance with claim 8, wherein said switch reset means includes:

time measuring means for measuring the duration of the electromagnetic device pickup time as a numerical value, in accordance with which a value is readable out of a memory for the extension of the total switch-on duration.

10. An apparatus in accordance with claim 1, which comprises:

a threshold switch actuated by the first electrical current measuring device to switch its output signal when the current flowing through the electromagnetic device attains a first value which is selected to be below said upper threshold value; and first switch opening means, connected to the output of the threshold switch, for opening, or rendering non-conductive, the first switching means after the initial energization of the electromagnetic device which is proportional to the time after the energization that the threshold switch switches its output.

11. An apparatus in accordance with claim 10, wherein said first switch opening means includes counter type timing circuits.

12. An apparatus for controlling the electrical cirrent through an electromagnetic device, which comprises:

voltage source;

a first current measuring device, connected in series with the electromagnetic device;

a first switching means for connecting the series combination of the electromagnetic device and the first current measuring device across the voltage source;

an input stage connected to close the first switching means and connected to be actuated by the first current measuring device, to open the first switching means when the current flowing therethrough increases to a predetermined upper threshold value;

a free-running circuit which includes:

a second current measuring device, a second switching means, connected in series with the second current measuring device across the electromagnetic device, for providing a return current path about the electromagnetic device, and second switch closing means for closing the second switching means when the fist switching means opens;

first switch operating means, actuated by the second current measuring device, for closing the first switching means for a predetermined time whenever the current flowing through the first switching means and the second current measuring devices decreases to a predetermined lower threshold value; and switch reset means, for opening at least one of the first and second switching means at a predetermined time after closing of the first switching means by the first switch closing means.

* * * * *

UNITED STATES PATENT AND TRADEMARK OFFICE
CERTIFICATE OF CORRECTION

PATENT NO. : 4,328,526

DATED : May 4, 1982

INVENTOR(S) : Peter Dilger et al

It is certified that error appears in the above—identified patent and that said Letters Patent is hereby corrected as shown below:

On The Title Page,

[54], "APPARATUS FOR CONTROLLING THE CURRENT THROUGH AN ELECTROMAGNETICALLY ACTUATABLE INJECTION VALVE IN AN INTERNAL COMBUSTION ENGINE VALVE IN AN INTERNAL COMBUSTION ENGINE"

should be

-APPARATUS FOR CONTROLLING THE CURRENT THROUGH AN ELECTROMAGNETIC CONSUMER, ESPECIALLY AN ELECTROMAGNETICALLY ACTUATABLE INJECTION VALVE IN AN INTERNAL COMBUSTION ENGINE-

Signed and Sealed this

***Thirty-first* Day of *August 1982***

[SEAL]

*Attest:*

GERALD J. MOSSINGHOFF

*Attesting Officer* *Commissioner of Patents and Trademarks*